(12) United States Patent
Bedecarrats et al.

(10) Patent No.: US 11,450,689 B2
(45) Date of Patent: Sep. 20, 2022

(54) INTEGRATED CIRCUIT WITH DOUBLE ISOLATION OF DEEP AND SHALLOW TRENCH-ISOLATION TYPE

(71) Applicant: STMicroelectronics SA, Montrouge (FR)

(72) Inventors: Thomas Bedecarrats, Saint Martin d'Heres (FR); Philippe Galy, Le Touvet (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 16/927,510

(22) Filed: Jul. 13, 2020

(65) Prior Publication Data
US 2021/0020660 A1 Jan. 21, 2021

(30) Foreign Application Priority Data
Jul. 17, 2019 (FR) ..................... 1908042

(51) Int. Cl.
*H01L 27/12* (2006.01)
(52) U.S. Cl.
CPC ............... *H01L 27/1203* (2013.01)
(58) Field of Classification Search
CPC .......... H01L 27/1203; H01L 21/76229; H01L 21/76264
See application file for complete search history.

(56) References Cited

U.S. PATENT DOCUMENTS

| | | | |
|---|---|---|---|
| 9,525,077 B1* | 12/2016 | Bi | H01L 21/76224 |
| 10,043,826 B1* | 8/2018 | Li | H01L 21/76283 |
| 10,460,982 B1* | 10/2019 | Li | H01L 21/823878 |
| 2006/0175659 A1* | 8/2006 | Sleight | H01L 21/84 257/347 |
| 2013/0119506 A1* | 5/2013 | Hokazono | H01L 21/76229 257/506 |
| 2014/0001555 A1* | 1/2014 | Cheng | H01L 21/76283 257/347 |
| 2014/0361371 A1 | 12/2014 | Comeau et al. | |
| 2016/0013206 A1* | 1/2016 | Vinet | H01L 21/26513 257/351 |
| 2017/0330896 A1* | 11/2017 | See | H01L 29/66901 |

OTHER PUBLICATIONS

Grenouillet et al., "UTBB FDSOI Transistors with Dual STI for a Multi-V, Strategy at 20nm Node and Below", 2012 International Electron Devices Meeting, 2012, pp. 3.6.1-3.6.4, doi: 10.1109/IEDM.2012.6478974. (Year: 2012).*

(Continued)

*Primary Examiner* — Vincent Wall
(74) *Attorney, Agent, or Firm* — Crowe & Dunlevy

(57) ABSTRACT

A silicon-on-insulator semiconductor substrate supports rows extending in a direction. Each row includes complementary MOS transistors and associated contact regions allowing back gate of the complementary MOS transistors to be biased. All transistors and associated contact regions of a given row are mutually isolated by a first trench isolation. Each row is bordered on opposed edges extending parallel to said direction by corresponding second trench isolations that are shallower than the first trench isolation.

11 Claims, 6 Drawing Sheets

(56) References Cited

OTHER PUBLICATIONS

INPI Search Report and Written Opinion for FR 1908042 dated Dec. 13, 2019 (8 pages).
Berthelon, R., et al: "A Novel Dual Isolation Scheme for Stress and Back-Bias Maximum Efficiency in FDSOI Technology," FDSOI Technology, Feb. 2, 2017 (4 pages).
Grenouillet, L., et al: "UTBB FDSOI Transistors With Dual STI for a Multi-V, Strategy at 20nm Node and Below," 2012 IEEE, pp. 3.6.1-3.6.4.

* cited by examiner

INTEGRATED CIRCUIT WITH DOUBLE ISOLATION OF DEEP AND SHALLOW TRENCH-ISOLATION TYPE

PRIORITY CLAIM

This application claims the priority benefit of French Application for Patent No. 1908042, filed on Jul. 17, 2019, the content of which is hereby incorporated by reference in its entirety to the maximum extent allowable by law.

TECHNICAL FIELD

Embodiments relate to integrated circuits and, more particularly, to standard cells, operator cells for example.

BACKGROUND

Standard cells, which are generally produced in CMOS technology, are cells that have already been optimized and stored in memory in a library of cells.

Thus, the designer of an integrated circuit may make use of these standard cells, positioning and interconnecting them depending on the structure and the functionality of the integrated circuit to be designed.

FIG. 1 illustrates a schematic top view of a type of integrated circuit IC1 that may generally comprise a plurality of standard cells.

FIG. 2 illustrates one portion of FIG. 1 and FIG. 3 is a cross section cut along the line in FIG. 2.

In FIG. 1, it may be seen that the integrated circuit IC1 comprises rows or tracks (here two rows have been shown) $TRK_n$ and $TRK_{n+1}$ extending parallel to the direction DR1, each comprising complementary MOS transistors, i.e., NMOS transistors TRN and PMOS transistors TRP, and the associated contact regions NNCT and PNCT allowing, as illustrated in FIG. 3, the back gate BG located under the buried insulating layer BOX of the silicon-on-insulator substrate to be biased.

All the transistors TRN, TRP and the associated contact regions NNCT and PNCT are mutually isolated by, on the one hand, a deep trench isolation DTI and a shallow trench isolation STI.

As was indicated above, the substrate is a silicon-on-insulator substrate here comprising a well 1 of P conductivity type surmounted by a well 2 of N conductivity type.

The well 2 possesses a portion 20 located under the buried insulating layer BOX, which itself is located under a segment 3, of N conductivity type, of a semiconductor film, in and on which segment the NMOS transistors TRN are produced.

Moreover, the well 2 possesses a portion 21 located under the buried insulating layer BOX, which itself is located under a segment 4, of P conductivity type, of the semiconductor film, in and on which segment the PMOS transistors TRP are produced.

The reference GR designates, in all of FIGS. 1 to 3, the gate lines of the complementary transistors TRP and TRN.

The standard cells usable in fully depleted silicon-on-insulator (FDSOI) technology with the 28 nanometer technological node require two types of masks, namely a shallow-trench-isolation mask and a deep-trench-isolation mask allowing the patterns of the DTI and STI trenches to be defined. The cost of a mask depends on the most aggressive pattern of this mask.

More precisely, as illustrated in FIG. 1, the width of the trench isolation DTI is 100 nanometers whereas the width of the trench isolation STI separating two adjacent rows $TRK_n$ and $TRK_{n+1}$ is 130 nanometers.

Moreover, the width of the trench isolation STI separating two adjacent complementary transistors of a given row is 72 nanometers.

The dimension of 130 nanometers corresponds to a so-called relaxed pattern, whereas a distance of 100 nanometers corresponds to a so-called standard pattern, and the distance of 72 nanometers corresponds to a so-called aggressive pattern.

Therefore, in this prior art, the cost of the STI mask, which comprises relaxed and aggressive patterns, will be defined by the aggressive pattern, whereas the cost of the DTI mask will be defined by the standard pattern.

The total cost of these masks is therefore the sum of a cost corresponding to a relaxed mask and of a cost corresponding to an aggressive mask.

This cost proves to be high.

There is therefore a need to decrease the total cost of the masks used in a standard-cell architecture of double STI-DTI isolation type.

SUMMARY

According to one aspect, an integrated circuit is provided, said circuit comprising in a silicon-on-insulator semiconductor substrate, for example a fully depleted silicon-on-insulator (FDSOI) substrate, in particular with a 28 nm technological node, rows extending in a first direction and each comprising complementary MOS transistors and the associated contact regions allowing the back gate of these transistors to be biased.

All the transistors and said associated contact regions of a given row are mutually isolated by a first trench isolation, for example a deep trench isolation, and each row is bordered on its two edges parallel to the first direction by two second trench isolations that are shallower than the first trench isolation, shallow trench isolations for example.

In other words, the majority of the isolation is for example achieved via deep trench isolations, this allowing the total cost of the mask to be decreased since, even though the cost of the deep-isolation mask is that of an aggressive mask, the cost of the shallow-isolation mask is that of a relaxed mask.

According to one embodiment, the silicon-on-insulator substrate comprises a semiconductor film in and within which are located said transistors and a buried insulating layer located under the semiconductor film.

The silicon-on-insulator substrate moreover comprises a first semiconductor well that is shallower than the first trench isolation (which is for example a deep trench isolation) and deeper than the second trench isolations (which are for example shallow trench isolations).

This first well possesses: a first portion located under the NMOS transistors, a second portion located under the PMOS transistors, these two portions being mutually electrically isolated by a portion of the first trench isolation, a third portion that passes through the semiconductor film in order to form said associated contact regions of the NMOS transistors, a fourth portion that passes through the semiconductor film in order to form said associated contact regions of the PMOS transistors, and a fifth portion located under the second trench isolations.

According to one embodiment, the first well has an N conductivity type.

According to one embodiment, the integrated circuit furthermore comprises a second semiconductor well located under the first semiconductor well, having a conductivity type opposite that of the first well, the (deep for example) first trench isolation extending into the second well.

The second well for example has a P conductivity type.

The (shallow, for example) second trench isolation may extend more deeply than the buried insulating layer.

As a variant, the second trench isolation may extend to level with the buried insulating layer.

In such a variant, the first trench isolation is this time a shallow trench isolation and the second trench isolations are trench isolations that are even less deep, resulting for example from localized oxidation of the semiconductor film.

The NMOS transistors are for example low-threshold-voltage (LVT) transistors whereas the PMOS transistors are for example regular-threshold-voltage (RVT) transistors.

The integrated circuit for example comprises a plurality of standard cells each comprising some of said rows.

BRIEF DESCRIPTION OF THE DRAWINGS

Other advantages and features of the invention will become apparent upon examining the detailed description of non-limiting embodiments and the appended drawings, in which.

DETAILED DESCRIPTION

Figure 1:
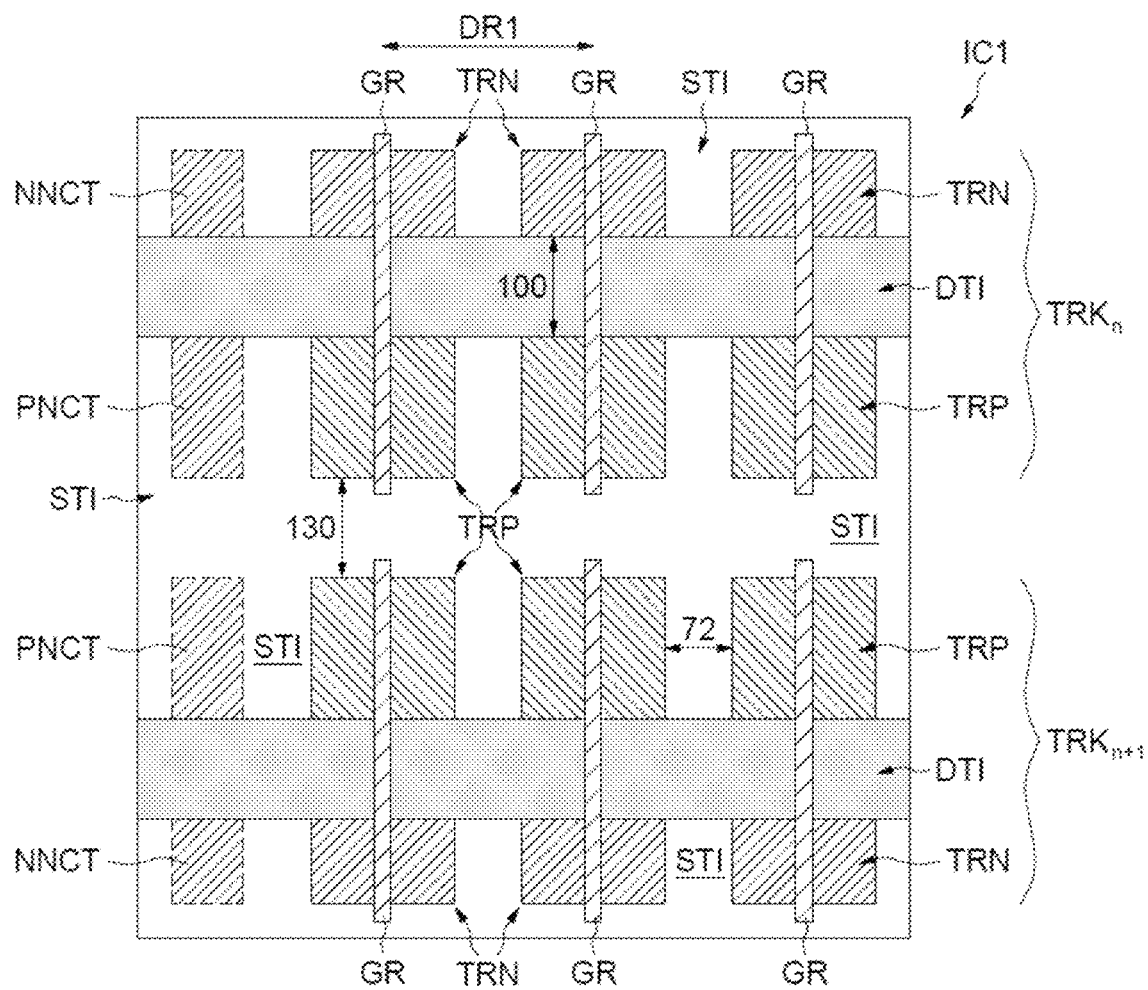
FIGS. 1-3 illustrate, respectively, a schematic top view, a portion and a cross section cut, of a type of integrated circuit that may generally comprise a plurality of standard cells.
Figure 2:
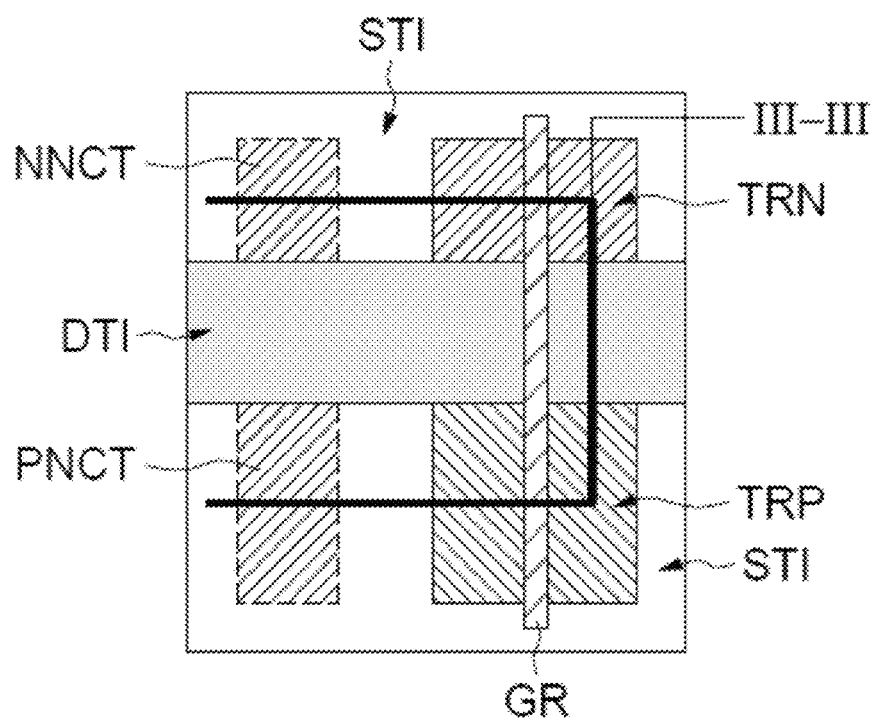
Figure 3:
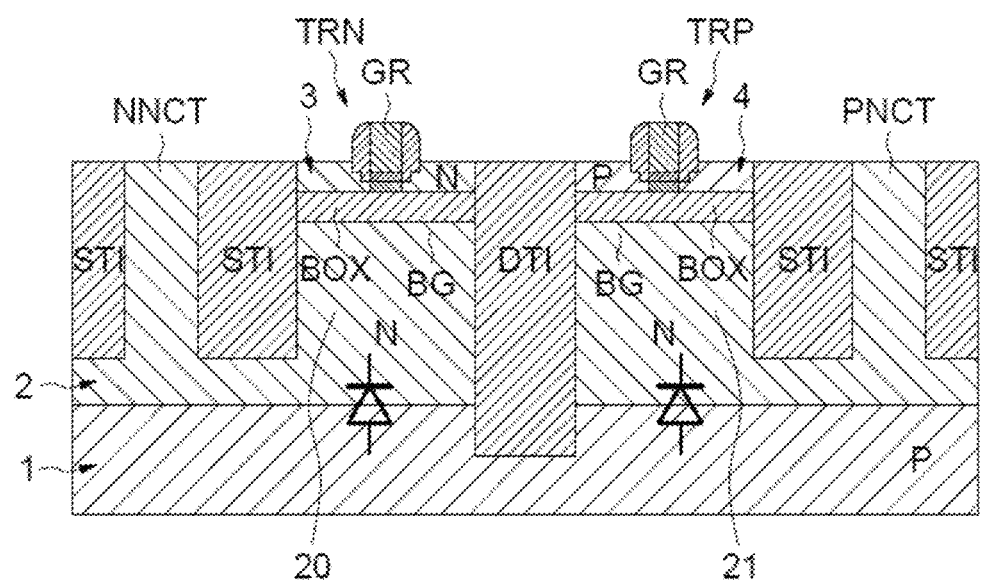
Figure 4:
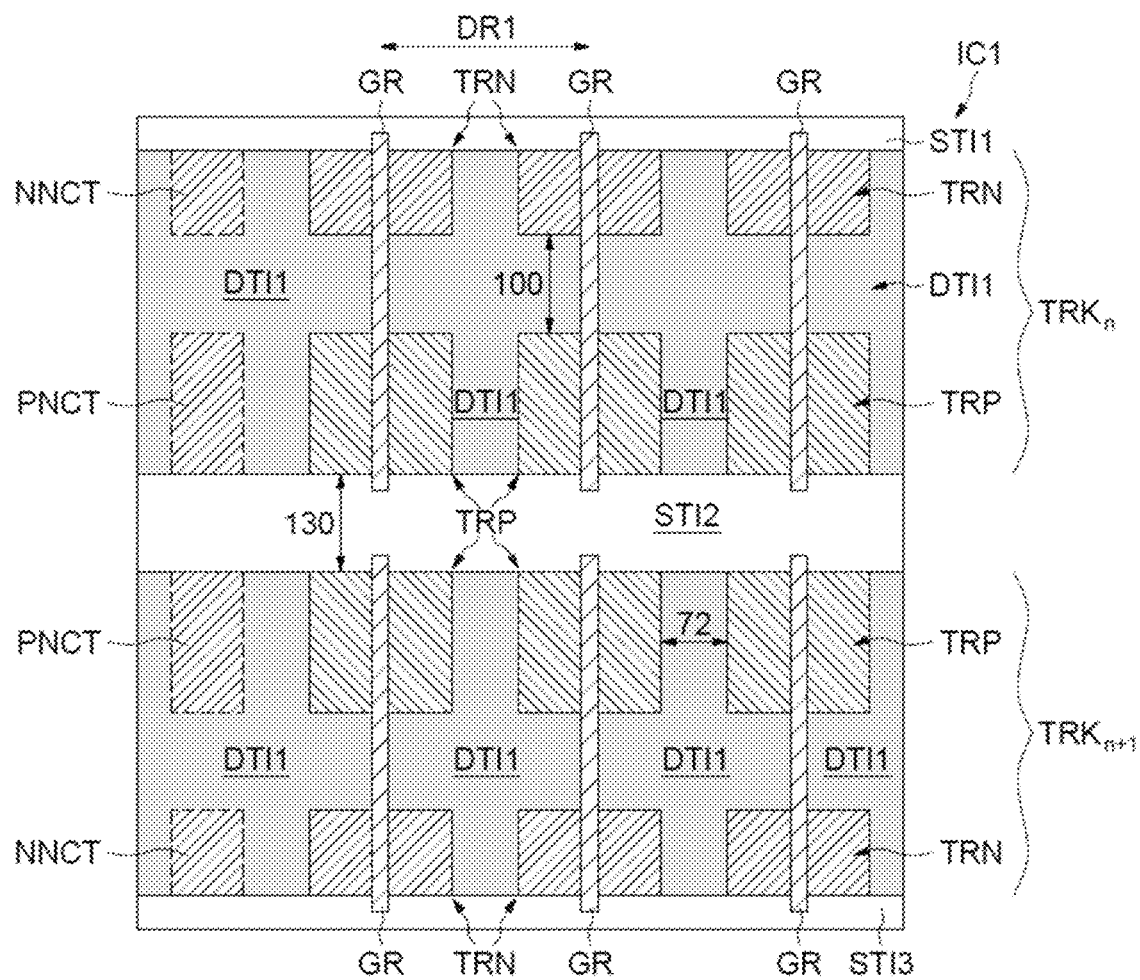
FIGS. 4-7 illustrate, respectively, a partial top view, a portion and two cross-sections of an integrated circuit comprising a plurality of standard cells.
Figure 5:
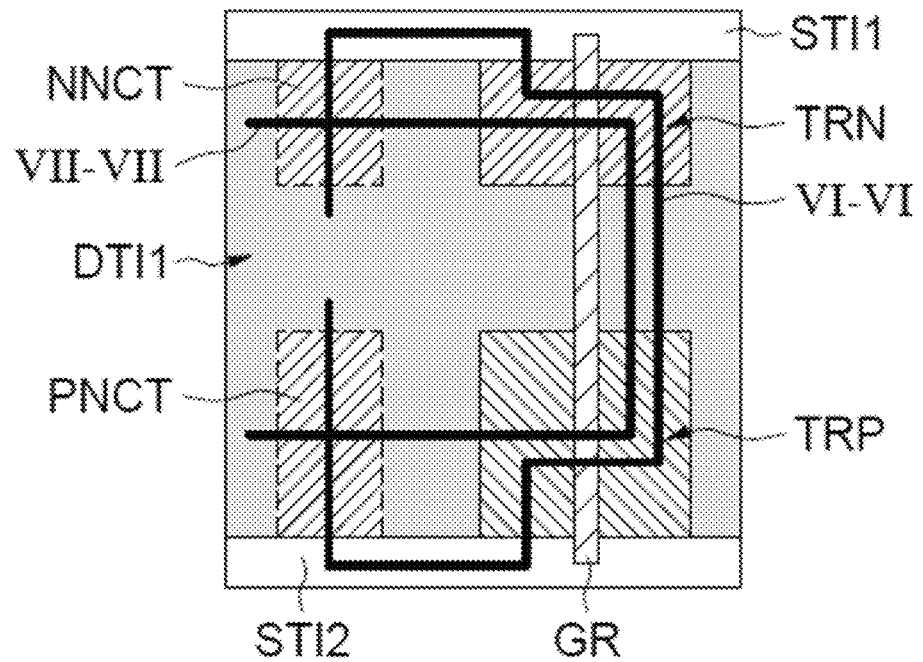
Figure 6:
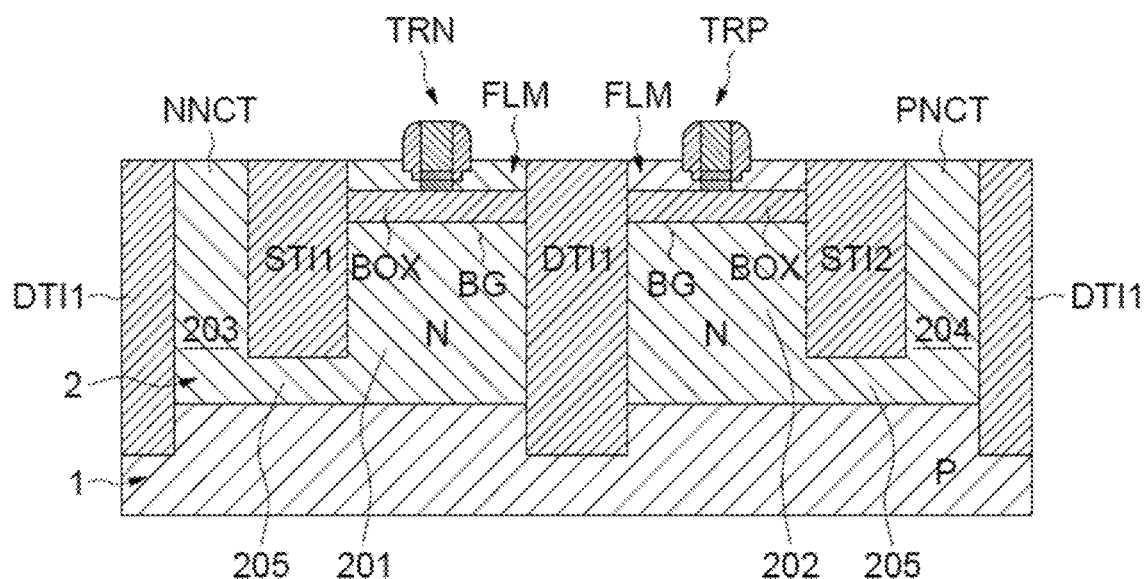
Figure 7:
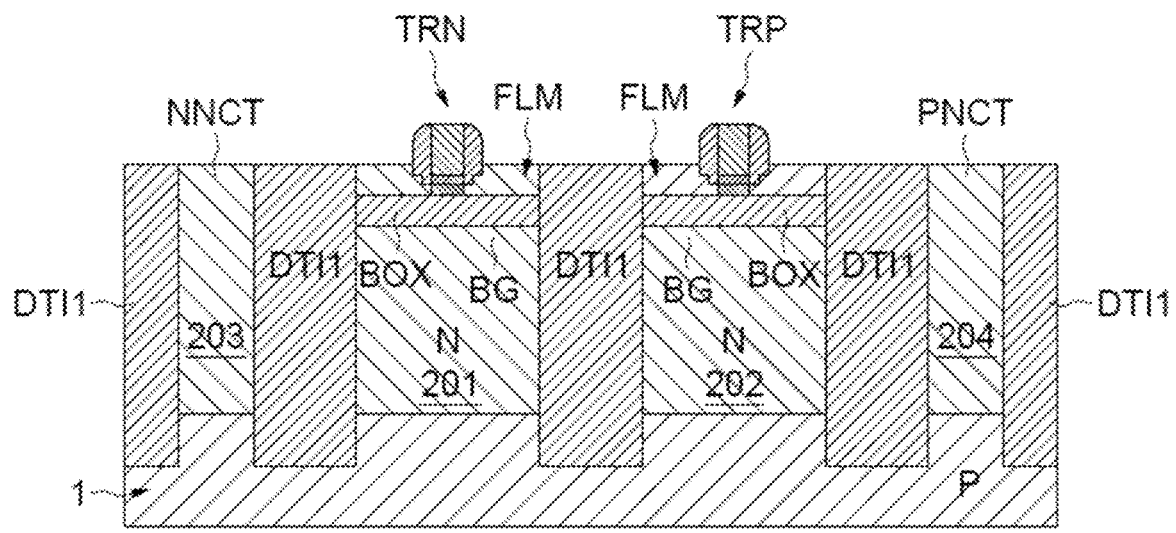

FIG. 4 illustrates a partial top view of an integrated circuit IC comprising a plurality of standard cells. FIG. 5 illustrates one portion of FIG. 4, FIG. 6 is a cross-sectional view cut along the line VI-VI in FIG. 5, and FIG. 7 is a cross-sectional view cut along the line VII-VII in FIG. 5.

In these figures, the substrate is a silicon-on-insulator substrate, for example a fully depleted silicon-on-insulator (FDSOI) substrate in a 28 nanometer technology.

NMOS transistors TRN and PMOS transistors TRP are produced in and on a semiconductor film FLM of this silicon-on-insulator substrate.

As illustrated in FIG. 4, the integrated circuit IC comprises rows or tracks $TRK_n$ and $TRK_{n+1}$ extending in a direction DR1.

Each row comprises complementary MOS transistors (NMOS transistors TRN and PMOS transistors TRP).

A pair of complementary transistors TRN and TRP share the same gate line GR.

Each row also comprises associated contact regions NNCT and PNCT allowing the back gate BG of all the NMOS transistors of the row and of all the PMOS transistors of the row to be biased, respectively.

All the transistors TRN and TRP and the associated contact regions NNCT and PNCT of a given row, $TRK_n$ for example, are mutually isolated by a first deep trench isolation DTI1. Typically, the depth of such a trench isolation DTI1 is about 1 micron.

The space between two complementary transistors TRN and TRP, measured perpendicular to the direction DR1, is equal to 100 nanometers, this corresponding to a spacing of a so-called standard mask.

The space between two transistors TRP or TRN of a given row is, for its part, equal to 72 nanometers, this corresponding to an aggressive character of a mask.

Each row $TRK_n$, $TRK_{n+1}$ is bordered on its two edges parallel to the first direction by two second trench isolations that are shallower than the first trench isolation.

More precisely, the row $TRK_n$ is bordered on its two edges parallel to the direction DR1 by the two shallow trench isolations STI1 and STI2 whereas the row $TRK_{n+1}$ is bordered by the two shallow trench isolations STI2 and STI3.

Typically, the depth of a shallow trench isolation is about 250 nanometers.

The spacing between two PMOS transistors TRP that are adjacent but belong to two different adjacent rows is equal to 130 nanometers.

The distance 130, for its part, corresponds to a relaxed character of a mask.

Therefore, the cost of the deep-isolation mask DTI1 is the cost of an aggressive mask whereas the cost of the shallow-isolation mask is the cost of a relaxed mask.

The total cost of the masks is therefore lower than that of the masks of the prior art.

As more particularly illustrated in FIGS. 6 and 7, the silicon-on-insulator substrate comprises a semiconductor film FLM in and within which are located the NMOS transistors TRN and PMOS transistors TRP.

The portion of the semiconductor film in and on which the transistor TRN is produced has an N conductivity type whereas the portion of the film FLM in which the PMOS transistor TRP is located has a P conductivity type.

A buried insulating layer BOX is located under the film FLM.

Moreover, the integrated circuit comprises a first semiconductor well 2 that is shallower than the first trench isolation DTI1 but deeper than the second trench isolations STI1 and STI2.

This first well, of N conductivity type, comprises: a first portion 201 located under the NMOS transistors TRN, and a second portion 202 located under the PMOS transistors TRP.

These two portions are mutually electrically isolated by one portion of the first trench DTI1.

The first semiconductor well 2 also comprises: a third portion 203 that passes through the semiconductor film FLM in order to form the associated contact regions NNCT of the NMOS transistors, a fourth portion 204 that passes through the semiconductor film FLM in order to form the associated contact regions PNCT of the PMOS transistors, and a fifth portion 205 located under the second trench isolations STI1 and STI2.

This fifth portion 205 allows the back gate BG of all the NMOS transistors of the row to be biased by way of the contact region NNCT, and allows the back gate BG of all the PMOS transistors TRP to be biased by way of the contact region PNCT.

It may, therefore, be seen here that the NMOS transistors are low-threshold-voltage transistors (LVT transistors) whereas the PMOS transistors are regular-threshold-voltage transistors (RVT transistors).

In a 28 nm FDSOI technology, many parameters modulate the threshold voltage of the transistors.

Threshold-voltage values in linear regime (supply voltage of 0.05 V) and in saturation regime (supply voltage of 1 V) for transistors having a gate width (W) of 1 micron and at a temperature of 25° C. will therefore be given by way of example.

More precisely, by way of indication, in linear regime, the threshold voltage of the LVT NMOS transistors is comprised between 355 mV and 380 mV.

The threshold voltage of the RVT PMOS transistors is comprised in absolute value between 455 mV and 500 mV.

By way of indication, in saturation regime, the threshold voltage of the LVT NMOS transistors is comprised between 250 mV and 300 mV.

The threshold voltage of the RVT PMOS transistors is comprised in absolute value between 315 mV and 400 mV.

The carrier substrate of the FDSOI substrate furthermore comprises the first well 2, a second semiconductor well 1 located under the first semiconductor well 2 and having a conductivity type opposite to that of the first well, here the P conductivity type.

The first trench isolation DTI1 extends into the second well 1.

In the embodiment of FIGS. 6 and 7, the second trench isolations STI1 and STI2 extend more deeply than the buried insulating layer.

Figure 8:
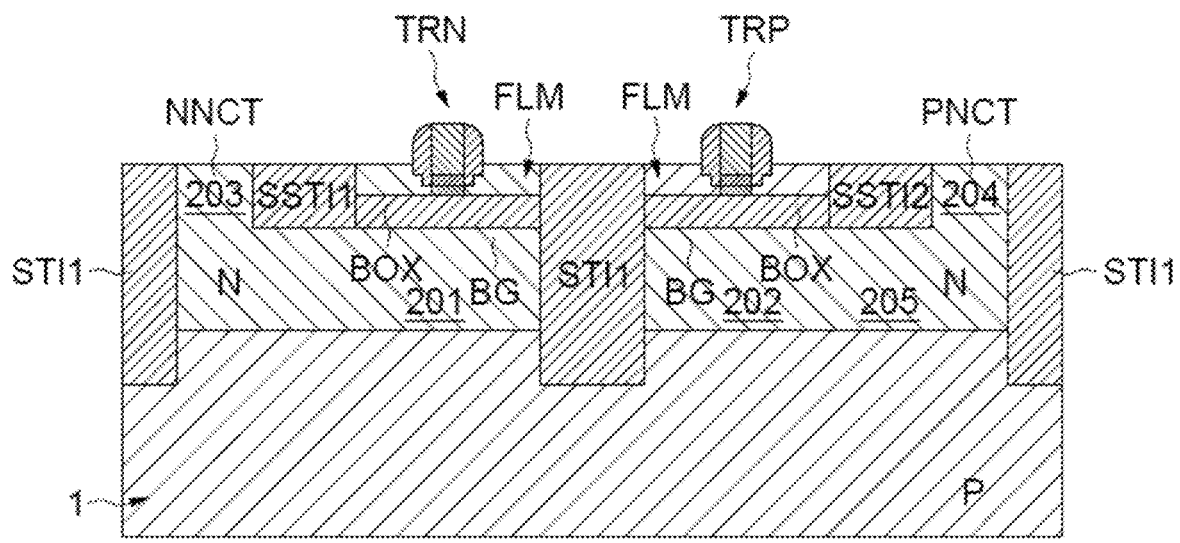
FIG. 8 illustrates a variant for the trench isolations.

As a variant, as illustrated in FIG. 8, it is possible for the second trench isolations SSTI1 and SSTI2 to extend to level with the buried insulating layer BOX, without extending therebeyond.

This is possible by virtue of a local oxidation of the semiconductor film.

In an FDSOI technology, the semiconductor film typically has a thickness of about a few nanometers.

The second trench isolations SSTI1 and SSTI2 then have a depth of about a few nanometers.

The first trench isolation DTI1 is then a trench isolation STI1, i.e. a trench isolation of the shallow type, but of course remains deeper than the second trench isolations SSTI1 and SSTI2.

Such an integrated circuit, produced from standard cells, may for example form a ring oscillator.

The invention is not limited to the embodiments that have been described, but encompasses all variants.

Thus, although low-threshold-voltage NMOS transistors (LVT transistors) and regular-threshold-voltage PMOS transistors (RVT transistors) have been described, the NMOS transistors could be RVT transistors and the PMOS transistors LVT transistors.

The invention claimed is:

1. An integrated circuit, comprising:
   a substrate;
   a first row of complementary NMOS and PMOS transistors supported by the substrate;
   a second row of complementary NMOS and PMOS transistors supported by the substrate;
   wherein the first and second rows extend parallel to each other in a first direction;
   wherein each row is bordered on one edge in said first direction adjacent p-channel MOS transistors of said complementary NMOS and PMOS transistors by a first shallow trench isolation and bordered on another edge in said first direction adjacent n-channel MOS transistors of said complementary NMOS and PMOS transistors by a second shallow trench isolation;
   a first semiconductor portion of the substrate which extends under the first shallow trench isolation;
   a second semiconductor portion of the substrate which extends under the second shallow trench isolation;
   wherein the complementary NMOS and PMOS transistors of each row of said first and second rows are isolated from each other by a first portion of a deep trench isolation extending in said first direction between said complementary NMOS and PMOS transistors; and
   for each row of said first and second rows, a first contact region separated from back gates of p-channel MOS transistors in said row by a second portion of said deep trench isolation extending in a second direction orthogonal to said first direction from said first portion of said deep trench isolation to said first shallow trench isolation, wherein the first contact region is coupled for biasing said back gates of p-channel MOS transistors in said row by the first semiconductor portion of the substrate, and a second contact region separated from back gates of p-channel MOS transistors in said row by a third portion of said deep trench isolation extending in the second direction from said first portion of said deep trench isolation to said second shallow trench isolation, wherein the second contact region is coupled for biasing said back gates of n-channel MOS transistors in said row by the second semiconductor portion of the substrate.

2. The integrated circuit according to claim 1, wherein the substrate is a silicon-on-insulator semiconductor substrate.

3. The integrated circuit according to claim 2, wherein the silicon-on-insulator semiconductor substrate is a fully depleted silicon-on-insulator substrate.

4. The integrated circuit according to claim 2, wherein the silicon-on-insulator substrate comprises:
   a semiconductor film in and within which said complementary NMOS and PMOS transistors are located;
   a buried insulating layer located under the semiconductor film;
   a first semiconductor region under said buried insulating layer and coupled to said first semiconductor portion of the substrate; and
   a second semiconductor region under said buried insulating layer and coupled to said second semiconductor portion of the substrate;
   wherein the first and second semiconductor regions wells are isolated from each other by said deep trench isolation.

5. The integrated circuit according to claim 4, wherein the first and second semiconductor regions are doped with a first conductivity type.

6. The integrated circuit according to claim 5, further comprising a semiconductor well located under the first and second semiconductor regions, wherein the semiconductor well is doped with a second conductivity type opposite the first conductivity type.

7. The integrated circuit according to claim 1, wherein n-channel MOS transistors have a first threshold-voltage and wherein the p-channel MOS transistors have a second threshold-voltage higher than the first threshold-voltage.

8. An integrated circuit, comprising:
   a silicon-on-insulator semiconductor substrate comprising a semiconductor film, a buried insulating layer located under the semiconductor film, and a semiconductor well region located under the buried insulating layer;
   a first deep trench isolation portion extending in a first direction completely through the semiconductor film, the buried insulating layer and the semiconductor well;
   a second deep trench isolation portion extending in a second direction completely through the semiconductor film, the buried insulating layer and the semiconductor well;
   a third deep trench isolation portion extending in the second direction completely through the semiconductor film, the buried insulating layer and the semiconductor well;

wherein the second direction is orthogonal to the first direction;
a first shallow trench isolation portion extending in the first direction completely through the semiconductor film and the buried insulating layer and partially through the semiconductor well;
a second shallow trench isolation portion extending in the first direction completely through the semiconductor film and the buried insulating layer and partially through the semiconductor well;
wherein the second deep trench isolation portion extends in the second direction between the first and second shallow trench isolation portions;
wherein the third deep trench isolation portion extends in the second direction between the first and second shallow trench isolation portions;
wherein the first, second and third deep trench isolation portions along with the first shallow trench isolation portion delimit a first transistor area in the semiconductor film and a first back gate in the semiconductor well below the first transistor area;
wherein the first, second and third deep trench isolation portions along with the second shallow trench isolation portion delimit a second transistor area in the semiconductor film and a second back gate in the semiconductor well below the first transistor area;
wherein the first and second deep trench isolation portions along with the first shallow trench isolation portion delimit a first contact in the semiconductor well that is electrically coupled to the first back gate by a portion of the semiconductor well located below the first shallow trench isolation portion; and
wherein the first and second deep trench isolation portions along with the second shallow trench isolation portion delimit a second contact in the semiconductor well that is electrically coupled to the second back gate by a portion of the semiconductor well located below the second shallow trench isolation portion.

9. The integrated circuit of claim 8, wherein the first transistor area supports an NMOS transistor and the second transistor area supports a PMOS transistor.

10. The integrated circuit of claim 8, wherein the first and second back gates have a same conductivity type.

11. The integrated circuit of claim 8, wherein the silicon-on-insulator semiconductor substrate is a fully depleted silicon-on-insulator substrate.

\* \* \* \* \*